United States Patent
Gimbert

(10) Patent No.: US 11,699,757 B2
(45) Date of Patent: Jul. 11, 2023

(54) HIGH DOSE IMPLANTATION FOR ULTRATHIN SEMICONDUCTOR-ON-INSULATOR SUBSTRATES

(71) Applicant: STMICROELECTRONICS, INC., Coppell, TX (US)

(72) Inventor: Jocelyne Gimbert, Crolles (FR)

(73) Assignee: STMICROELECTRONICS, INC., Coppell, TX (US)

( * ) Notice: Subject to any disclaimer, the term of this patent is extended or adjusted under 35 U.S.C. 154(b) by 172 days.

(21) Appl. No.: 16/168,771

(22) Filed: Oct. 23, 2018

(65) Prior Publication Data

US 2019/0058062 A1 Feb. 21, 2019

Related U.S. Application Data

(60) Continuation of application No. 14/982,052, filed on Dec. 29, 2015, now Pat. No. 10,134,898, which is a
(Continued)

(51) Int. Cl.
*H01L 29/78* (2006.01)
*H01L 27/12* (2006.01)
(Continued)

(52) U.S. Cl.
CPC .... *H01L 29/7848* (2013.01); *H01L 21/26506* (2013.01); *H01L 21/26513* (2013.01);
(Continued)

(58) Field of Classification Search
CPC combination set(s) only.
See application file for complete search history.

(56) References Cited

U.S. PATENT DOCUMENTS 4,176,372 A * 11/1979 Matsushita ........... H01L 21/314
257/372
5,116,771 A * 5/1992 Karulkar ........... H01L 21/76202
257/369
(Continued)

FOREIGN PATENT DOCUMENTS

CN 103367430 * 11/2016

OTHER PUBLICATIONS

Peter V. Schwartz, "Oxygen Incorporation During Low-Temperature Chemical Vapor Deposition and Its Effects on the Electronic Properties of Epitaxial Si And Si1-xGex Films", A Dissertation Presented to the Faculty of Princeton University, Office of Naval Research Contract N00014-90-J-1316. (Year: 1992).*
(Continued)

*Primary Examiner* — Thanhha S Pham
(74) *Attorney, Agent, or Firm* — Seed Intellectual Property Law Group LLP

(57) ABSTRACT

Methods and structures for forming highly-doped, ultrathin layers for transistors formed in semiconductor-on-insulator substrates are described. High dopant concentrations may be achieved in ultrathin semiconductor layers to improve device characteristics. Ion implantation at elevated temperatures may mitigate defect formation for stoichiometric dopant concentrations up to about 30%. In-plane stressors may be formed adjacent to channels of transistors formed in ultrathin semiconductor layers.

10 Claims, 5 Drawing Sheets

Related U.S. Application Data division of application No. 14/169,875, filed on Jan. 31, 2014, now Pat. No. 9,876,110.

(51) Int. Cl.
  *H01L 21/70* (2006.01)
  *H01L 21/84* (2006.01)
  *H01L 21/265* (2006.01)
  *H01L 29/66* (2006.01)
  *H01L 21/8238* (2006.01)
  *H01L 21/324* (2006.01)
  *H01L 29/16* (2006.01)
  *H01L 29/161* (2006.01)
  *H01L 29/165* (2006.01)

(52) U.S. Cl.
  CPC .......... *H01L 21/324* (2013.01); *H01L 21/707* (2013.01); *H01L 21/823807* (2013.01); *H01L 21/823814* (2013.01); *H01L 21/84* (2013.01); *H01L 27/1203* (2013.01); *H01L 29/161* (2013.01); *H01L 29/1608* (2013.01); *H01L 29/66628* (2013.01); *H01L 29/66772* (2013.01); *H01L 29/165* (2013.01); *H01L 29/66795* (2013.01)

(56) References Cited

U.S. PATENT DOCUMENTS

| | | | | |
|---|---|---|---|---|
| 6,194,255 | B1* | 2/2001 | Hiroki | H01L 29/66757 257/E29.275 |
| 6,403,433 | B1* | 6/2002 | Yu | H01L 29/66772 257/E21.415 |
| 6,503,805 | B2* | 1/2003 | Wang | H01L 21/2652 438/303 |
| 6,528,851 | B1* | 3/2003 | Yu | H01L 29/78621 257/E29.147 |
| 6,709,913 | B2* | 3/2004 | Hsu | H01L 21/2652 438/217 |
| 6,797,555 | B1* | 9/2004 | Hopper | H01L 21/26506 438/217 |
| 6,812,523 | B1* | 11/2004 | Chu | H01L 21/2254 257/335 |
| 6,849,527 | B1* | 2/2005 | Xiang | H01L 21/26506 438/528 |
| 6,987,037 | B2* | 1/2006 | Forbes | C30B 1/023 438/197 |
| 7,002,214 | B1 | 2/2006 | Boyd et al. | |
| 7,005,333 | B2* | 2/2006 | Li | H01L 21/28194 257/369 |
| 7,081,657 | B2 | 7/2006 | Faris | |
| 7,115,955 | B2* | 10/2006 | Messenger | H01L 29/66742 257/369 |
| 7,247,569 | B2* | 7/2007 | Boyd | H01L 21/26533 438/699 |
| 7,417,248 | B2* | 8/2008 | Li | H01L 21/28185 257/55 |
| 7,687,356 | B2* | 3/2010 | Coronel | H01L 29/78684 438/285 |
| 7,736,996 | B2 | 6/2010 | Theodore et al. | |
| 7,968,459 | B2 | 6/2011 | Bedell et al. | |
| 7,989,306 | B2 | 8/2011 | Liu et al. | |
| 8,110,483 | B2 | 2/2012 | Abadeer et al. | |
| 8,329,557 | B2 | 12/2012 | Brailove et al. | |
| 8,426,920 | B2* | 4/2013 | Zhu | H01L 29/78648 257/347 |
| 8,492,854 | B1 | 7/2013 | Cheng et al. | |
| 8,603,894 | B2 | 12/2013 | Majumdar et al. | |
| 8,673,699 | B2 | 3/2014 | Adam et al. | |
| 8,748,258 | B2 | 6/2014 | Cheng et al. | |
| 8,877,620 | B2* | 11/2014 | Clark | H01L 29/78 438/558 |
| 8,890,264 | B2* | 11/2014 | Dewey | H01L 29/66803 257/410 |
| 8,900,973 | B2 | 12/2014 | Berliner et al. | |
| 8,941,178 | B2 | 1/2015 | Yamamoto et al. | |
| 8,987,069 | B1* | 3/2015 | Adam | H01L 21/02664 438/149 |
| 9,059,212 | B2 | 6/2015 | Haensch et al. | |
| 9,123,642 | B1* | 9/2015 | Lee | H01L 21/823814 |
| 9,171,757 | B2 | 10/2015 | Doris et al. | |
| 9,406,751 | B2 | 8/2016 | Liu et al. | |
| 9,466,720 | B2 | 10/2016 | Liu et al. | |
| 9,607,901 | B2 | 3/2017 | Liu et al. | |
| 9,634,103 | B2 | 4/2017 | Vinet et al. | |
| 10,115,803 | B2* | 10/2018 | Quay | H01L 29/78 |
| 2002/0125502 | A1* | 9/2002 | Baba | H01L 27/0922 257/200 |
| 2003/0080361 | A1* | 5/2003 | Murthy | H01L 29/7834 257/288 |
| 2003/0146494 | A1* | 8/2003 | Puchner | H01L 29/7833 257/616 |
| 2004/0129979 | A1 | 7/2004 | Park et al. | |
| 2005/0055494 | A1* | 3/2005 | Doris | H01L 29/665 257/E21.443 |
| 2005/0112811 | A1* | 5/2005 | Hsu | H01L 29/458 438/197 |
| 2005/0285192 | A1* | 12/2005 | Zhu | H01L 29/7848 257/347 |
| 2006/0006469 | A1* | 1/2006 | Hwang | H01L 21/84 257/351 |
| 2006/0134872 | A1* | 6/2006 | Hattendorf | H01L 29/7834 438/300 |
| 2006/0148150 | A1* | 7/2006 | Kavalieros | H01L 29/66537 438/197 |
| 2007/0178689 | A1* | 8/2007 | Nakamura | H01L 33/40 438/615 |
| 2007/0257315 | A1* | 11/2007 | Bedell | H01L 21/26513 257/350 |
| 2008/0185665 | A1* | 8/2008 | Liaw | H01L 21/823814 257/408 |
| 2008/0217686 | A1* | 9/2008 | Majumdar | H01L 29/66636 257/347 |
| 2008/0283918 | A1* | 11/2008 | Cheng | H01L 21/2652 257/347 |
| 2008/0311732 | A1* | 12/2008 | Dokumaci | H01L 21/28114 438/525 |
| 2009/0045462 | A1 | 2/2009 | Ren et al. | |
| 2009/0057672 | A1* | 3/2009 | Kobayashi | H01L 29/78696 257/59 |
| 2009/0065784 | A1* | 3/2009 | Kobayashi | H01L 29/78696 257/72 |
| 2009/0289305 | A1* | 11/2009 | Majumdar | H01L 27/1203 257/351 |
| 2010/0032684 | A1 | 2/2010 | Bedell et al. | |
| 2010/0279479 | A1 | 11/2010 | Hatem et al. | |
| 2011/0037125 | A1 | 2/2011 | Cheng et al. | |
| 2011/0095366 | A1 | 4/2011 | Abadeer et al. | |
| 2011/0227157 | A1 | 9/2011 | Yang et al. | |
| 2011/0291100 | A1 | 12/2011 | Cheng et al. | |
| 2011/0291189 | A1 | 12/2011 | Cheng et al. | |
| 2012/0104498 | A1* | 5/2012 | Majumdar | H01L 29/66545 257/351 |
| 2012/0139047 | A1 | 6/2012 | Luo et al. | |
| 2012/0146142 | A1 | 6/2012 | Zhu et al. | |
| 2012/0156847 | A1 | 6/2012 | Loubet et al. | |
| 2012/0235215 | A1 | 9/2012 | Flachowsky et al. | |
| 2012/0313168 | A1* | 12/2012 | Cheng | H01L 29/7849 257/347 |
| 2013/0015525 | A1 | 1/2013 | Cheng et al. | |
| 2013/0052801 | A1 | 2/2013 | Berliner et al. | |
| 2013/0056766 | A1* | 3/2013 | Hotta | H01L 27/1259 257/E21.411 |
| 2013/0069164 | A1 | 3/2013 | Marino et al. | |
| 2013/0099319 | A1 | 4/2013 | Adam et al. | |
| 2013/0146959 | A1* | 6/2013 | Cheng | H01L 29/94 257/310 |
| 2013/0153964 | A1* | 6/2013 | Guo | H01L 21/8258 257/192 |

(56) References Cited

U.S. PATENT DOCUMENTS

| | | | |
|---|---|---|---|
| 2013/0341722 A1* | 12/2013 | Illgen | H01L 21/84 |
| | | | 257/351 |
| 2014/0024181 A1 | 1/2014 | Adam et al. | |
| 2014/0048886 A1 | 2/2014 | Chuang et al. | |
| 2014/0099763 A1 | 4/2014 | Alptekin et al. | |
| 2014/0167164 A1 | 6/2014 | Adam et al. | |
| 2014/0203363 A1* | 7/2014 | Adam | H01L 29/66742 |
| | | | 257/347 |
| 2014/0284719 A1 | 9/2014 | Khakifirooz et al. | |
| 2014/0312423 A1 | 10/2014 | Cheng et al. | |
| 2015/0093861 A1* | 4/2015 | Loubet | H01L 21/84 |
| | | | 438/154 |
| 2015/0221648 A1* | 8/2015 | Gimbert | H01L 21/324 |
| | | | 257/351 |
| 2015/0228501 A1 | 8/2015 | Bedell et al. | |
| 2016/0093735 A1 | 3/2016 | Dittmar et al. | |
| 2016/0155844 A1* | 6/2016 | Yin | H01L 29/78696 |
| | | | 257/347 |

OTHER PUBLICATIONS

Saenger et al., "Effect of Elevated Implant Temperature on Amorphization and Activation in As-implanted Silicon-on-insulator Layers," *Mater. Res. Soc. Symp. Proc.* 1070:1070-E05-02, 2008 (7 pages).

\* cited by examiner

HIGH DOSE IMPLANTATION FOR ULTRATHIN SEMICONDUCTOR-ON-INSULATOR SUBSTRATES

BACKGROUND

Technical Field

The technology relates to structures and methods for forming high doping concentrations by implantation in ultrathin layers of semiconductor-on-insulator substrates.

Description of the Related Art

Transistors are fundamental device elements of modern digital processors and memory devices, and have found numerous applications in various areas of electronics, including power electronics. Currently, there are a variety of transistor designs or types that may be used for different applications. Various transistor types include, for example, bipolar junction transistors (BJT), junction field-effect transistors (JFET), metal-oxide-semiconductor field-effect transistors (MOSFET), vertical channel or trench field-effect transistors, and superjunction or multi-drain transistors. One type of transistor that has emerged within the MOSFET family of transistors is a fin field-effect transistor (finFET). The finFET is a three-dimensional structure for which a channel, source, and drain are formed on a narrow fin protruding from a substrate.

In some cases, dopants may be introduced into a transistor structure or into nearby structures to induce strain in a channel region of the device, or to improve electrical characteristics of the device. For example, germanium (Ge) may be added to a transistor formed in silicon (Si) to convert the channel region to SiGe or to strain the transistor's channel. SiGe can exhibit higher carrier mobility than Si semiconductors. Straining of a channel can improve carrier mobility in the channel for both n- and p-type devices.

BRIEF SUMMARY

Structures and methods relating to integrated transistors having highly-doped, ultrathin semiconductor layers in semiconductor-on-insulator (SOI) substrates are described. In some embodiments, stoichiometric doping concentrations of up to approximately 30% of Ge in Si may be obtained without amorphization of an ultrathin Si layer. High doping concentrations may be formed in transistor channels, in some embodiments. In some implementations, high doping concentrations may be formed adjacent to a transistor channel, so as to induce strain in the channel. The doping of thin semiconductor layers to high concentrations may be carried out by a combination of elevated-temperature, ion implantation and spike anneal processes.

According to some embodiments, a method for forming a highly-doped, ultrathin semiconductor-on-insulator structure comprises heating a semiconductor-on-insulator substrate to a temperature between approximately 350° C. and approximately 500° C., and implanting a dopant into an ultrathin semiconductor layer of the substrate at a dose between about $0.5 \times 10^{16}$ cm$^{-2}$ and about $2 \times 10^{16}$ cm$^{-2}$ while the substrate is heated. The ultrathin semiconductor layer may be a Si layer less than approximately 10 nm, and the implanted dopant may be Ge. In some embodiments, the implantation may be performed through a thin material layer (e.g., an oxide layer) deposited over the ultrathin semiconductor layer. The implanted substrate may be subjected to a spike or rapid thermal annealing step after ion implantation to reduce an amount of defects that may have been formed during the ion implantation.

Among the structures that may be formed using the methods described below are complimentary MOS devices. In some implementations, an ultrathin semiconductor-on-insulator structure that may be formed using the implantation methods comprises a bulk substrate, a thin insulating layer formed on the bulk substrate, and an ultrathin semiconductor layer formed over the insulating layer, wherein a first portion of the ultrathin semiconductor layer is implanted with an element at a concentration between approximately 15% and 40% that improves the electrical characteristics of the ultrathin semiconductor layer, and a second portion of the ultrathin semiconductor layer is not implanted with the element. The ultrathin semiconductor layer may be a Si layer that is less than about 10 nm thick, and the element may be Ge. The insulating layer may be between about 5 nm and about 50 nm thick. In some embodiments, the first portion that is implanted may be used to form a channel region of a field-effect transistor. For example, a body of a transistor may be defined in the first portion. According to some embodiments, the first portion may include at least one region that is formed adjacent to a channel region of a FET, so as to provide at least one in-plane stressor that induces strain in the channel region of the FET. In some implementations, one or more transistors of a first conductivity type may be formed using heavily implanted regions of the first portion, and one or more transistors of a second conductivity type may be formed using regions of the second portion that is not implanted with the element.

The foregoing and other aspects, embodiments, and features of the present teachings can be more fully understood from the following description in conjunction with the accompanying drawings.

BRIEF DESCRIPTION OF THE SEVERAL VIEWS OF THE DRAWINGS

The skilled artisan will understand that the figures, described herein, are for illustration purposes only. It is to be understood that in some instances various aspects of the embodiments may be shown exaggerated or enlarged to facilitate an understanding of the embodiments. In the drawings, like reference characters generally refer to like features, functionally similar and/or structurally similar elements throughout the various figures. The drawings are not necessarily to scale, emphasis instead being placed upon illustrating the principles of the teachings. Where the drawings relate to microfabrication of integrated devices, only one device may be shown of a large plurality of devices that may be fabricated in parallel. The drawings are not intended to limit the scope of the present teachings in any way.

Figure 1A:
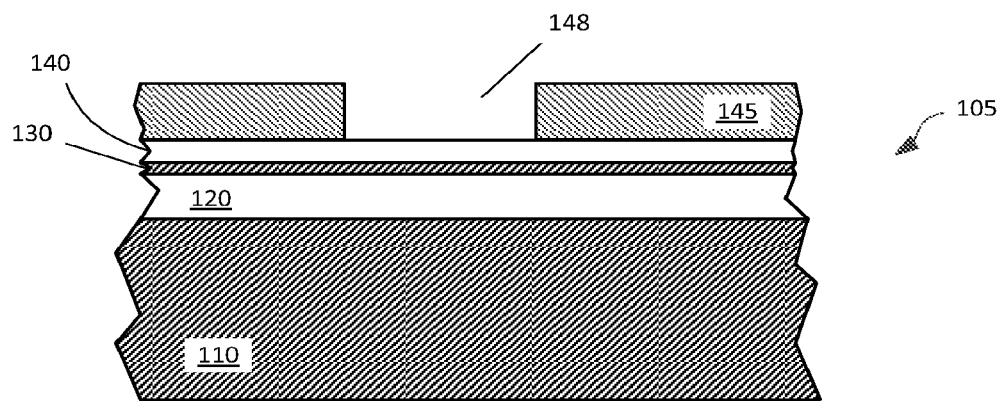
FIGS. 1A-1E depict integrated structures and method steps for forming a highly-doped, ultrathin channel region on a buried oxide layer, according to some embodiments.

The features and advantages of the embodiments will become more apparent from the detailed description set forth below when taken in conjunction with the drawings.

DETAILED DESCRIPTION

In recent years, some integrated circuit components such as diodes and transistors have been formed using so-called "silicon-on-insulator" (SOI) substrates, in which active regions of the devices are formed in a layer of silicon disposed over an insulating layer (typically an oxide layer) that is disposed over a bulk silicon substrate. Because of the underlying or buried oxide layer, electrical isolation between nearby devices and the bulk substrate can be improved. Benefits of SOI technology include reduction in parasitic capacitance, reduction in power consumption, and reduction in CMOS latch-up. With advances in integrated circuit technology, the thickness of the silicon layer overlying the buried oxide has decreased with time. Today, ultrathin silicon layers may be formed over a buried oxide layer, and active regions of integrated devices may be formed in the ultrathin layers. For example, an ultrathin SOI structure may comprise a silicon layer less than approximately 10 nm thickness overlying an insulating layer that may be about 25 nm thick. A channel and/or source and drain regions for a transistor may be formed in the ultrathin silicon layer.

To further improve the performance of SOI devices, doping of the semiconductor may be employed. For example, doping a Si layer with Ge to obtain SiGe can provide higher mobilities for electrons and holes, higher device speed, and lower junction leakage than bulk Si. There are at least two ways to form SiGe starting with a Si substrate. One way is to use epitaxial growth. A second way is to employ Ge ion implantation to dope an existing Si layer. However, each of these approaches may have limitations.

Epitaxial growth can produce uniform and controlled doping concentrations, but requires a seed layer to initiate crystal growth. One approach is to epitaxially grow SiGe on a Si substrate. In applications where an ultrathin semiconductor-on-insulator structure is desired, epitaxial growth cannot be initiated from the buried oxide layer, and epitaxial growth on an ultrathin Si layer may exceed a desired layer thickness for subsequently fabricated devices. If epitaxial growth could be performed, because of a lattice constant mismatch between SiGe and Si, strain is induced in the SiGe and underlying Si layers as the SiGe layer is epitaxially grown. In some cases, this strain causes dislocations or defects in the SiGe during its growth, which can adversely affect device performance to unacceptable levels. Additionally, epitaxial growth may require sustained exposure of a substrate to high temperatures (e.g., greater than 600° C.), which may have undesirable effects on device structures, such as ingress of oxygen into a gate and channel region of a FET.

Another option is to employ ion implantation. In this approach, Ge ions, for example, may be accelerated at a high electric potential and forcibly driven into a Si layer. Such a process, however, can disrupt the crystal structure of the Si layer yielding a thin layer that is more amorphous rather than crystalline. Amorphization can severely degrade device performance or result in unacceptable device performance. A high temperature anneal (e.g., at temperatures between about 600° C. and about 1100° C.) can be used to recrystallize the Si layer and improve the electrical properties of the SiGe layer, but such high temperatures may have undesirable effects on devices, such as ingress of oxygen into a gate and/or channel region of a FET. As may be appreciated, doping of thin and ultrathin semiconductor layers on insulators poses fabrication challenges.

The inventors have found that a combination of elevated-temperature, ion implantation and a subsequent spike anneal can be used to obtain highly-doped, ultrathin semiconductor-on-insulating layers of suitable quality for integrated device fabrication. According to some embodiments, implantation of Ge in ultrathin Si layers of SOI substrates may be carried out at temperatures between about 350° C. and about 500° C. The elevated temperatures can mitigate, and in some cases avoid, amorphization of the ultrathin layers. Ion implantation may be localized (e.g., through mask vias) or may extend across an entire wafer. In some embodiments, after implantation, the substrate may be subjected to a rapid thermal annealing process to improve crystal quality. According to some embodiments, the thermal budget for the elevated-temperature implantation and a subsequent spike anneal is lower than that for a conventional epitaxial growth process.

FIGS. 1A-1E depict integrated structures and method steps for forming highly-doped, ultrathin channel regions above a buried oxide layer, according to some embodiments. An SOI wafer, or a region of a wafer, may include a bulk substrate 110, an insulating layer 120, and a semiconductor layer 130. For the examples discussed below, the bulk substrate 110 may comprise a Si substrate, the insulating layer 120 may comprise an oxide layer, and the semiconductor layer 130 may comprise an ultrathin Si layer, although the embodiments are not limited to only these materials. The methods and structures formed may apply to other semiconductor systems, e.g., GaN, SiC, InGaAs, InP, CdTe, etc.

According to some embodiments, an ultrathin semiconductor layer 130 may comprise a crystalline semiconductor having a thickness between approximately 3 nm and approximately 15 nm. The crystalline quality of the semiconductor layer 130 may be high (e.g., defect densities less than $10^5$ defects/cm$^2$ in some embodiments, less than $10^4$ defects/cm$^2$ in some embodiments, less than $10^3$ defects/cm$^2$ in some embodiments, and yet less than less than $10^2$ defects/cm$^2$ in some embodiments). In some implementations, the semiconductor layer 130 may be formed by layer transfer and bonding of a Si layer from another wafer, followed by a chemical-mechanical polishing step to planarize and thin the semiconductor layer (e.g., a "smart cut" process).

A hard mask material 140 may be formed over the semiconductor layer 130. In some embodiments, the hard mask material comprises an inorganic material such as an oxide, a nitride, or a metal. The hard mask material 140 may exhibit etch selectivity over the underlying semiconductor layer 130. The hard mask material may be deposited locally or across an entire wafer, and have a thickness equal to or greater than the thickness of the underlying semiconductor layer 130. The hard mask 140 may be deposited by a plasma deposition process in some embodiments, though any suitable deposition technique may be used.

As an example of layer thicknesses, the semiconductor layer 130 may have a thickness of approximately 6 nm, the hard mask material 140 may have a thickness of approximately 9 nm, and the buried oxide layer may have a thickness of approximately 25 nm, although the embodiments are not limited to these thicknesses. In some embodiments, the buried oxide layer may have a thickness between about 5 nm and about 50 nm. The ultrathin semiconductor layer may have a thickness up to about 10 nm, and the hard mask material may have a thickness between about 5 nm and about 20 nm.

Figure 1B:
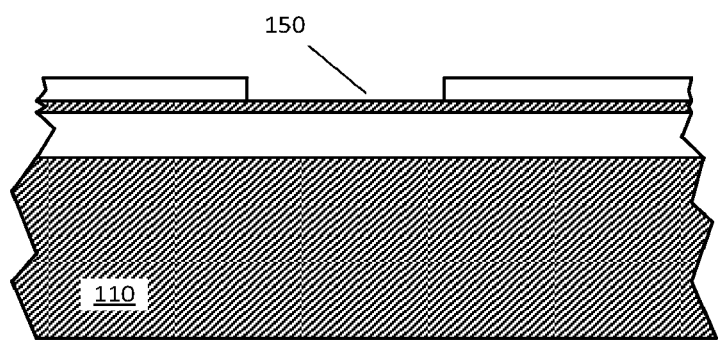

A resist 145 may be deposited and patterned over the hard mask material 140 using any suitable lithography technique, so as to open a region 148 at which one or more SiGe channels may be formed. The resist 145 may exhibit etch selectivity over the underlying hard mask material. As an example, the resist may be a photoresist. Once patterned, the substrate 105 may be etched (e.g., using a reactive-ion etching process) to open a region 150 in the hard mask material 140, as depicted in FIG. 1B. The resist 145 may be stripped from the wafer.

Figure 1C:
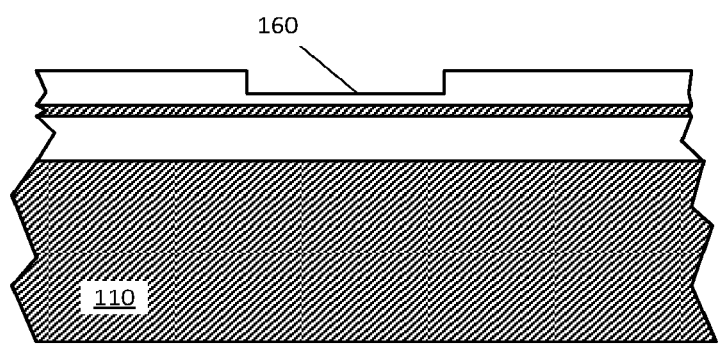

According to some embodiments, a thin oxide 160 may then be deposited on the exposed semiconductor layer 130. The oxide 160 may have a thickness between about 1 nm and about 8 nm. According to some embodiments, the oxide 160 may be about 3 nm in thickness. The resulting structure may appear as depicted in FIG. 1C.

Figure 1D:
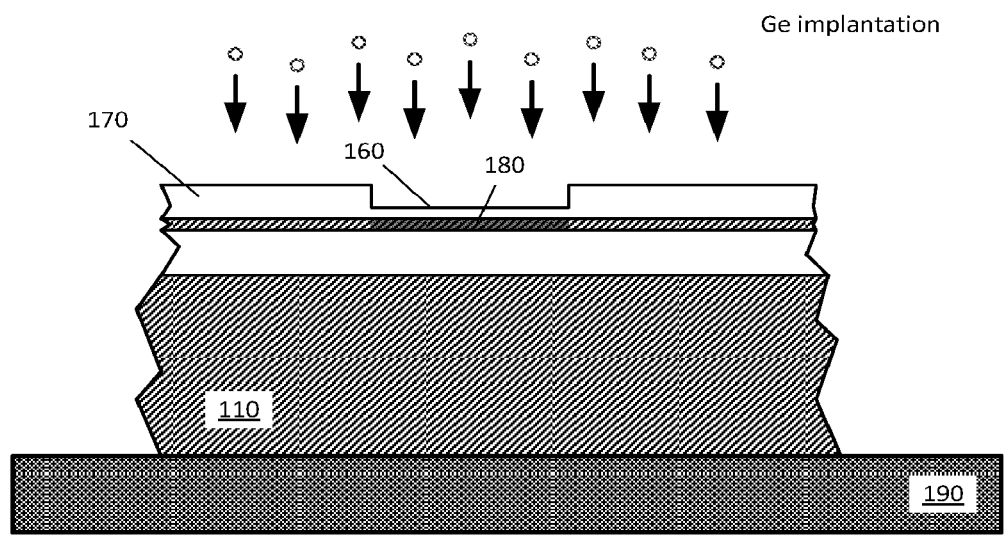

The substrate may then be subjected to an elevated-temperature, ion implantation, as illustrated in FIG. 1D. The substrate may be heated during ion implantation (e.g., via a hot plate 190), or the environment in which ion implantation occurs may be elevated in temperature. According to some embodiments, the substrate may be heated to a temperature between about 350° C. and about 500° C. Heating of the substrate during implantation can mitigate amorphization of the thin semiconductor layer 130. In some implementations, Ge is implanted into an ultrathin Si layer at a dose between about $0.5 \times 10^{16}$ cm$^{-2}$ and about $2 \times 10^{16}$ cm$^{-2}$. Such high doses might normally lead to amorphization of the thin semiconductor layer, but do not appreciably amorphize the layer when the layer is heated within the above-described temperature range.

Ion implantation may provide a different and distinguishable dopant profile compared to doping via epitaxial growth. Epitaxial doping may provide a more uniform dopant profile in a vertical direction of the thin semiconductor layer 130. In comparison, ion implantation may result in dopant concentration gradients and variation in the vertical direction. For example, epitaxial doping may yield a substantially flat-top dopant profile, whereas implantation doping may yield a more Gaussian shaped dopant profile. The elevated temperature during ion implantation, and a subsequent annealing step, may homogenize the dopant concentration in the ultrathin semiconductor layer to reduce concentration gradients, in some embodiments.

The energy used for ion implantation may depend upon the ion used, the thickness of the semiconductor layer 130, and the thickness of the thin oxide layer 160. Because the semiconductor layer is thin, ion energies can be low as compared to deep implantation. Lower energies can help reduce amorphization of the semiconductor layer 130. As an example, an implantation energy of about 1 keV may be used to implant Ge into a 6-nm-thick semiconductor layer 130. In some embodiments, the implantation energy may be between about 0.5 keV and about 3 keV.

In various embodiments, the thickness of the hard mask material 140 may be selected such that it stops implanted ions in the hard mask in regions 170 adjacent to the SiGe implanted region 180, thereby preventing the implanted ions from reaching the semiconductor layer 130. However, at the opening in the hard mask, the ions may pass through the thin oxide layer 160 and enter the semiconductor layer 130, so as to highly dope the semiconductor layer locally. According to some embodiments, the doping level may be between about 15% and about 40%. In some embodiments, the doping level may be between about 25% and about 35%. In some implementations, the doping level of the channel region may be approximately 30%.

The terms "approximately" and "about" may be used to mean within ±20% of a target dimension or target value in some embodiments, within ±10% of a target value in some embodiments, within ±5% of a target value in some embodiments, and yet within ±2% of a target value in some embodiments. The terms "approximately" and "about" may include the target value.

Figure 1E:
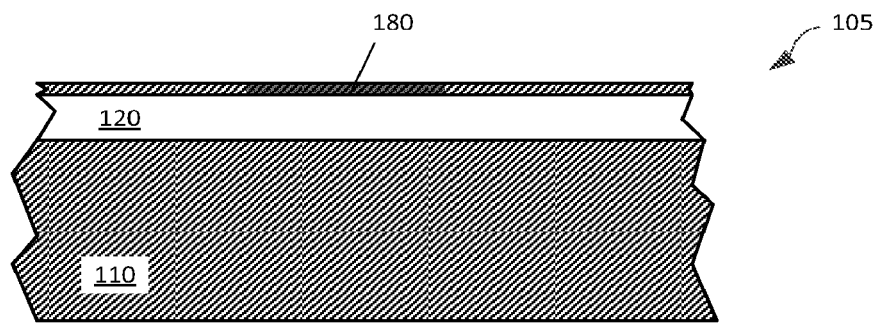

After ion implantation, the hard mask material 140 and thin oxide 160 may be stripped from the wafer using any suitable process leaving a highly doped SiGe region 180 in the ultrathin semiconductor layer. The resulting substrate 105 may appear as depicted in FIG. 1E. One or more SiGe channels for FETs may be formed at this region. Because of the elevated-temperature and low-energy ion implantation, the defect density in the SiGe region 180 may be low enough to provide suitable device performance.

In some embodiments, the defect density in the implanted region after ion implantation may be unacceptable for device fabrication. The substrate 105 may then be subjected to a rapid thermal annealing or spike annealing step. A rapid thermal annealing step may elevate the substrate or its thin semiconductor layer to a peak temperature between about 500° C. and about 1200° C. for a period less than one second, in some embodiments. In some implementations, a rapid anneal may last for a period having a duration that is between about 0.1 second and about 1 second. In some embodiments, a rapid thermal anneal may last for a period between about 1 second and about 10 seconds. The rapid anneal may reduce defects to an acceptable level for device fabrication. The substrate 105 may then be used to form active regions of transistors in the SiGe region 180, as well as other devices in adjacent regions.

In some implementations, the thin oxide layer 160 may not be formed on the exposed ultrathin semiconductor layer 130, and implantation may be directly into the exposed ultrathin semiconductor layer. However, the use of the thin oxide layer 160 may help improve the uniformity of dopant concentration in a vertical direction of the substrate, in some embodiments. In other embodiments, a material other than an oxide (e.g., a nitride, a polymer, a low-Z metal) may be deposited over the wafer and exposed semiconductor layer 130 prior to implantation and removed after implantation.

FIGS. 2A-2F depict integrated structures and method steps for forming raised source and drain complimentary MOSFET (CMOS) devices that include in-plane stressors adjacent a channel region, according to some embodiments. The described method steps enable in-plane stressors comprising SiGe to be formed adjacent to Si channels of PMOS transistors. Straining of silicon can be used to improve some of its electrical properties. For example compressive straining of silicon can improve the hole mobility within silicon. Highly strained Si integrated electronic devices may achieve performance levels that are competitive with SiGe devices. However, to achieve a high strain with SiGe stressors, a Ge dopant concentration between about 25% and about 35% may be needed in some embodiments. In some embodiments, a Ge dopant concentration is about 30%.

Figure 2A:
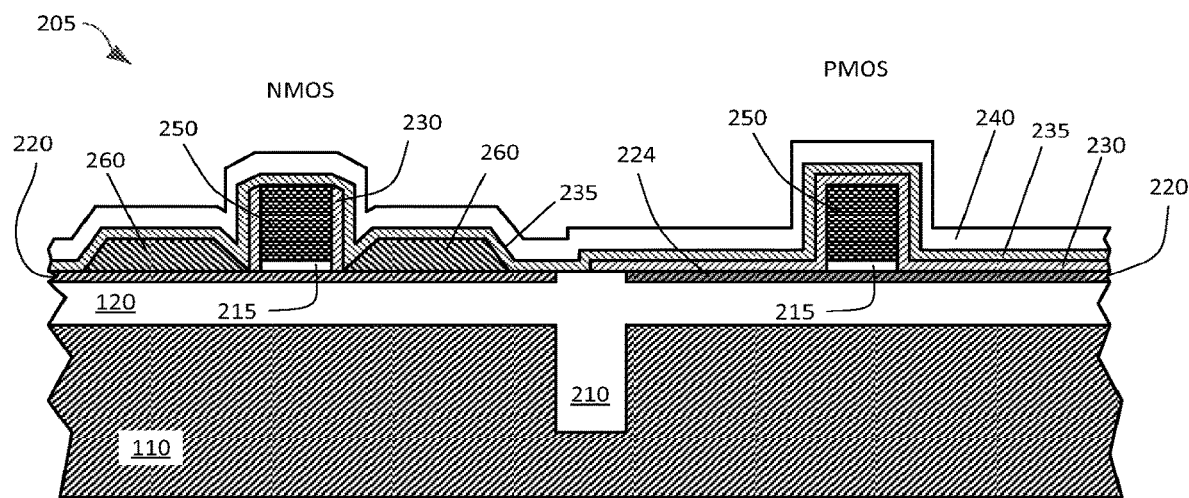
FIGS. 2A-2F depict integrated structures and method steps for forming a raised source and drain complimentary MOSFET device that includes in-plane stressors adjacent a channel region, according to some embodiments.

FIG. 2A depicts CMOS structures formed on an SOI substrate having an ultrathin semiconductor layer. As depicted in the drawing, FET structures for NMOS and PMOS transistors are formed on an SOI substrate having an ultrathin semiconductor layer 220. The SOI substrate may comprise a bulk semiconductor (Si) 110, a buried oxide layer 120, and the ultrathin semiconductor layer 220. According to some embodiments, some transistor structures may include raised source and drain (RSD) regions 260. Shallow trench isolation (STI) 210 structures may be formed between the devices, in some embodiments, using any suitable STI process. An STI structure 210 may extend through the ultrathin semiconductor layer 220.

The ultrathin semiconductor layer 220 may be formed of Si, in some embodiments. The semiconductor layer 220 may be doped in some regions to have a first conductivity type (e.g., p-type conductivity for NMOS transistors), and doped in other regions to have a second conductivity type (e.g., n-type conductivity for PMOS transistors). According to some embodiments, a channel region for one or both types of transistors may be doped with another material (e.g., Ge) to improve device performance. In some implementations, the NMOS devices may comprise Si channel regions formed in the ultrathin semiconductor layer 220 that have not been doped, and the PMOS devices may comprise at least one region 224 formed in the ultrathin semiconductor layer 220 that has been doped with another material (e.g., doped with Ge using the techniques described above in connection with FIGS. 1A-1E).

According to some embodiments, each of the CMOS transistors may comprise a gate structure comprising a gate conductor 250 and a gate insulator 215. In some embodiments, the gate conductor may comprise polysilicon. In some implementations, the gate conductor 250 may comprise a metal. The gate insulator 215 may be any suitable non-conductive material, e.g., an oxide or a nitride.

At least one spacer layer may be formed over the gate structures and surrounding areas. According to some embodiments, a first spacer layer 230 may be formed over the gate structures and surrounding areas. A portion of the first spacer layer 230 may be etched away to expose source and drain regions at the NMOS transistors. Raised source and drain (RSD) structures 260 may be formed in the exposed source and drain regions by epitaxial growth. A second spacer layer 235 may then be formed over the gate structures and surrounding regions, as depicted in FIG. 2A. In some embodiments, the entire region may be covered with a passivation layer 240, e.g., an oxide. The passivation layer 240 may be applied by any suitable deposition process, e.g., plasma deposition, thermal evaporation, spin-on and bake, etc.

Figure 2B:
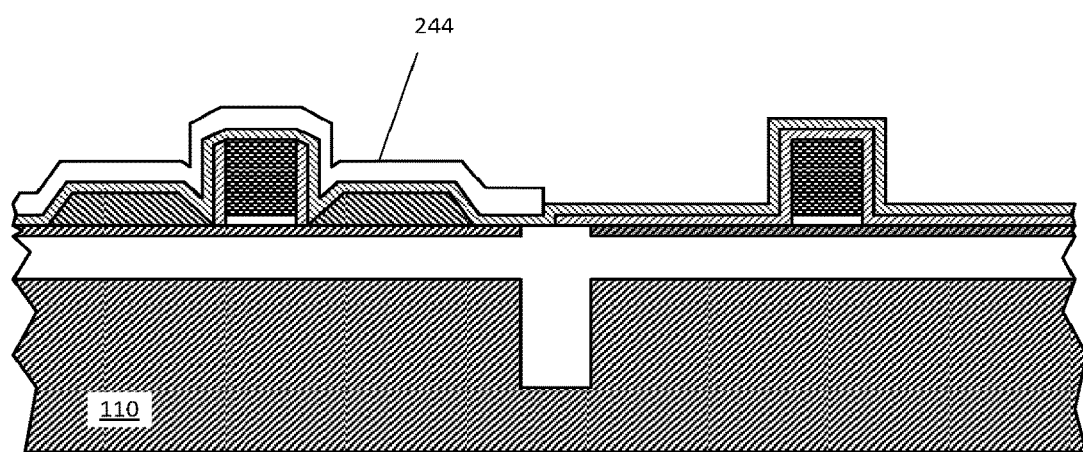

A portion of the passivation layer 240 may be removed to expose PMOS transistor regions, as depicted in FIG. 2B. The portion of passivation layer 240 may be removed using any suitable lithography process. For example, a photoresist may be applied and patterned over the passivation layer. A region of the resist over the PMOS transistors may be exposed (positive tone resist) or not exposed (negative tone resist), and developed, so as to open a hole in the resist and expose the passivation layer. The substrate may then be subjected to a selective etch that removes the exposed passivation layer 240, but does not appreciably remove the underlying spacer layers 230, 235, and leaves a protective layer 244 over the NMOS devices. The etch may be a wet etch, in some embodiments, or a dry etch, in some implementations. The resist may then be stripped from the substrate.

Figure 2C:
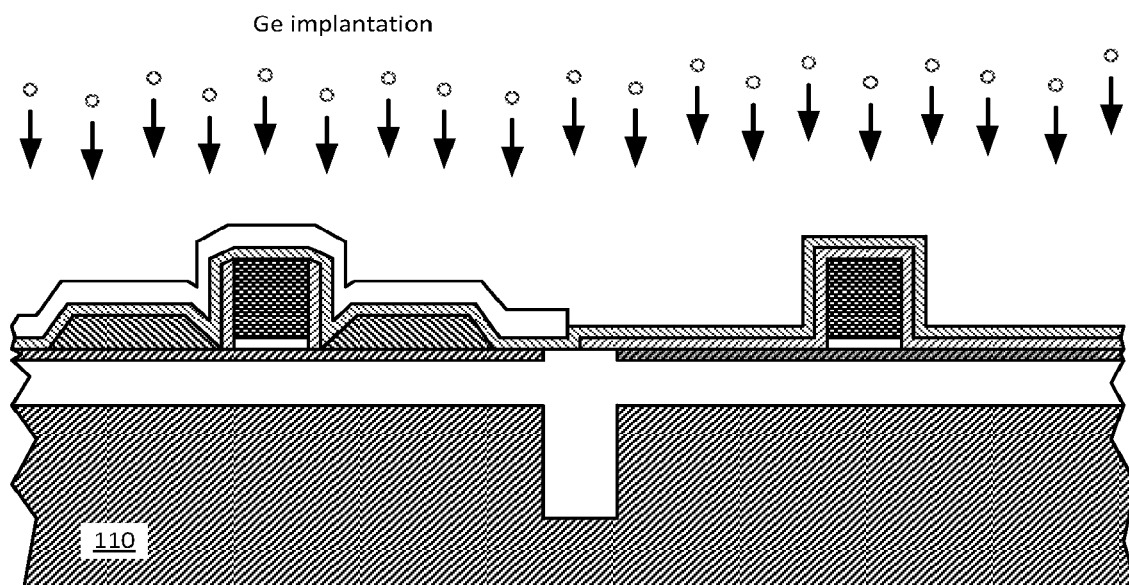
Figure 2D:
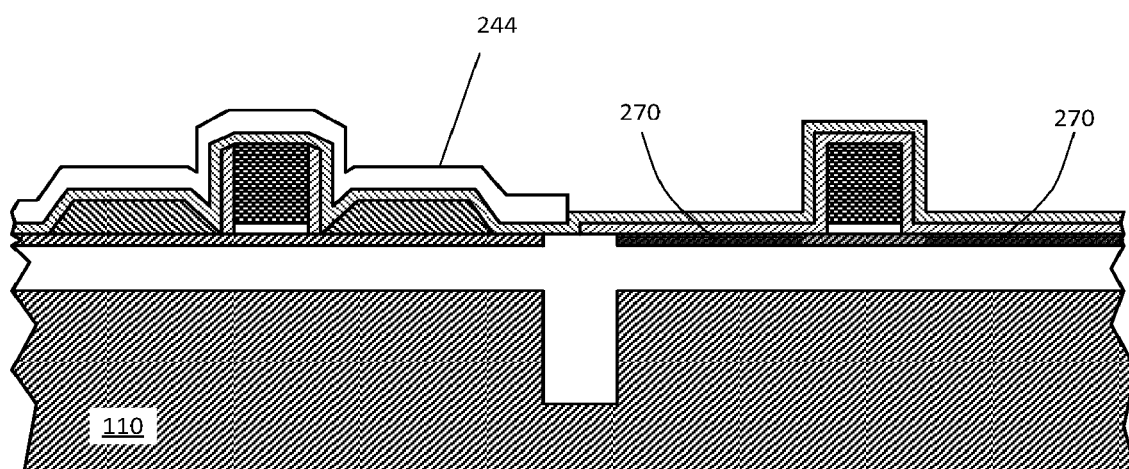

The resulting structure, depicted in FIG. 2B, may then be subjected to ion implantation, as depicted in FIG. 2C. Ion implantation may be done at high doses and at elevated temperatures to yield high dopant concentrations in the ultrathin layer 220, as described above in connection with FIGS. 1D-1E. For the embodiment shown in FIG. 2C, the gate structures, RSD structures, and passivation region 244 prevent implanted ions from reaching the semiconductor layer 220 lying beneath these structures. As a result, heavily-doped regions 270 are formed adjacent the gate of the PMOS transistor, as depicted in FIG. 2D. These heavily-doped regions 270 form in-plane stressors that can exert stress on the channel region of the PMOS transistor. In some embodiments, the heavily-doped regions 270 induce compressive stress in the channel region, and thereby improve the mobility of holes in the channel region. The heavily-doped regions 270 may be doped with Ge to a stoichiometric concentration between about 15% and about 40%. In some embodiments, the doping level may be between about 25% and about 35%. In some implementations, the doping level of the in-plane stressors may be approximately 30%.

Figure 2E:
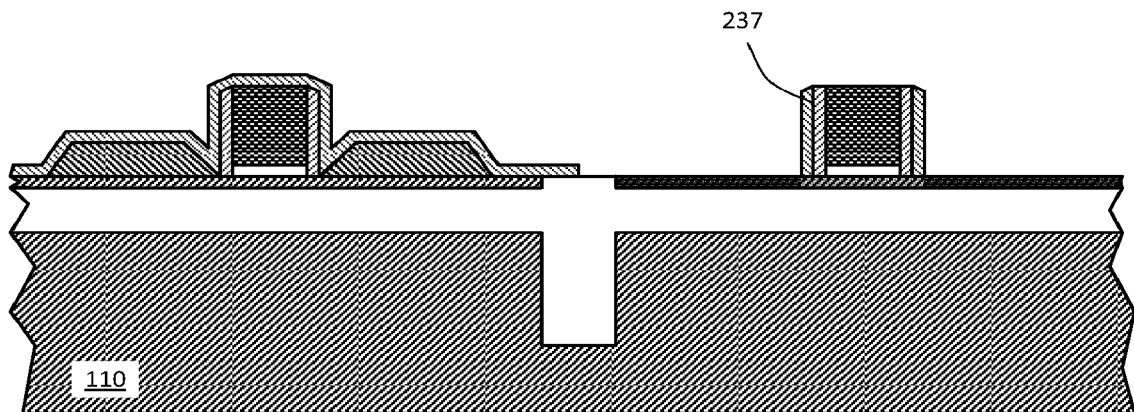

The spacer layers 230, 235 may be etched from the substrate in the PMOS regions, so as to expose source and drain regions of the ultrathin semiconductor layer and leave spacer structures 237 on the sidewalls of the gate structure, as depicted in FIG. 2E. According to some embodiments, the removal of spacer layer 230, 235 is performed using a dry anisotropic etch that is selective to nitride (or the spacer material) and substantially stops on the SiGe regions 270. Because the etch is anisotropic, the spacer structures 237 remain after etch-through of the spacer layers over the source and drain regions.

Removal of the spacer layers 230, 235 from the substrate in the PMOS regions may be done in at least two ways. In a first process sequence, the passivation region 244 over the NMOS regions may first be removed by a blanket etch that selectively etches the passivation material, e.g., etches oxide (or the passivation material), but does not appreciably etch the spacer layer material. A photoresist may then be applied and patterned so as to expose PMOS regions. A subsequent anisotropic etch may then be used to remove the spacer layers from the PMOS regions, yielding the structure depicted in FIG. 2E.

In an alternative process sequence, the passivation region 244 shown in FIG. 2D may be used as a hard mask. The spacer layers may then be selectively and anisotropically etched to remove them from the PMOS regions, yet leave the spacer structures 237. The passivation region 244 may then be removed by selective etching to yield a structure as depicted in FIG. 2E. In this alternative process sequence, the passivation region 244 may extend across the STI region, so that the STI region will not be etched after removal of the spacer layers.

According to some embodiments, a substrate may be subjected to a rapid thermal annealing step, as described above. The rapid or spike anneal may recrystallize the semiconductor layer and/or remove a majority of defects that result from the ion implantation, and improve electrical characteristics of the device. The annealing step may occur after ion implantation, in some embodiments, or after removal of the spacer layers from the PMOS regions.

Figure 2F:
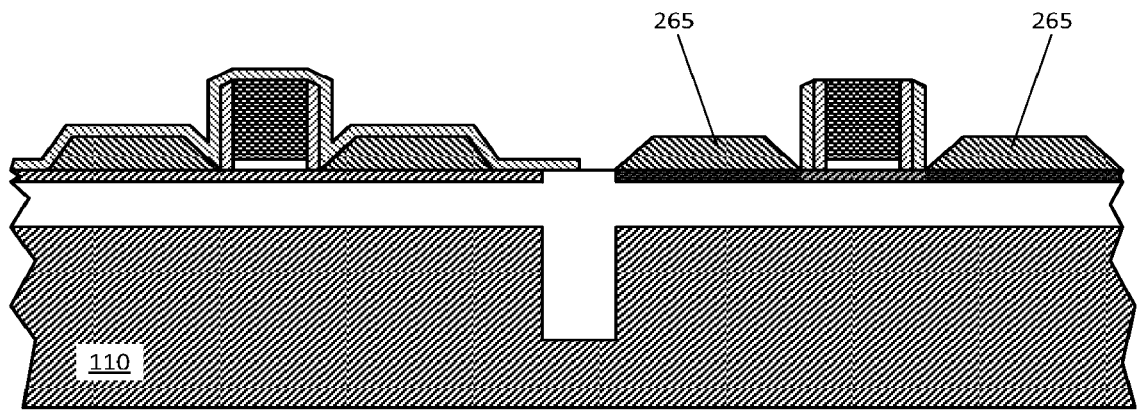

In various embodiments, raised source and drain structures 265 may be formed over the in-plane stressors 270, as depicted in FIG. 2F. The RSD structures 265 may be formed by epitaxial growth, and may comprise Si or SiGe material of opposite type conductivity to that of the device's body region below the gate. Accordingly, RSD CMOS transistors having in-plane stressors can be formed on ultrathin semiconductor layers of SOI substrates.

The techniques described above may be applied to other types of transistors. For example, heavily doped channel regions and/or in-fin stressors may be formed for finFET devices.

Transistors or devices fabricated according to the present teachings may be formed in an integrated circuit in large numbers and/or at high densities. The circuits may be used for various low-power applications, including but not limited to, circuits for operating smart phones, computers, tablets, PDAs, video displays, and other consumer electronics. For example, a plurality of CMOS transistors fabricated in accordance with the disclosed embodiments may be incorporated in processor or control circuitry used to operate one of the aforementioned devices.

The discussions above are directed primarily to SiGe strain-inducing structures. For example, SiGe in-plane stressor may be used to induce compressive stress in a channel of a PMOS transistor. In other embodiments, SiC may be used to impart tensile stress in NMOS transistors.

The technology described herein may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments. Additionally, a method may include more acts than those illustrated, in some embodiments, and fewer acts than those illustrated in other embodiments.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

The invention claimed is:

1. A device, comprising:
   a substrate;
   an insulating layer on the substrate;
   an ultrathin semiconductor layer on the insulating layer, the ultrathin semiconductor layer having a first surface and a second surface opposite the first surface, the ultrathin semiconductor layer including:
     a first portion including a conductivity dopant between the first and second surface of the ultrathin semiconductor layer, the first portion having a first doping level;
     a second portion laterally adjacent to the first portion and including the conductivity dopant between the first and second surface of the ultrathin semiconductor layer, the second portion having a second doping level that is different than the first doping level; and
     a third portion laterally adjacent to the first portion and including the conductivity dopant between the first and second surface of the ultrathin semiconductor layer, the first portion being between the second portion and the third portion, the third portion having a third doping level that is different than the first doping level; and
   a transistor on the ultrathin semiconductor layer, the transistor including a channel that is at least a part of the first portion of the ultrathin semiconductor layer, wherein the ultrathin semiconductor layer includes gallium and the conductivity dopant includes nitrogen.

2. The device of claim 1, wherein the first doping level ranges from about 15% to about 40%.

3. The device of claim 1, wherein the first doping level ranges from about 25% to about 35%.

4. The device of claim 1, wherein the conductivity dopant does not extend into the insulating layer.

5. The device of claim 1, wherein the first dopant profile of the first portion of the ultrathin semiconductor layer varies from the first surface to the second surface.

6. A device, comprising:
   a substrate;
   an insulating layer on the substrate;
   an ultrathin semiconductor layer on the insulating layer, the ultrathin semiconductor layer having a first surface and a second surface opposite the first surface, the ultrathin semiconductor layer including:
     a channel region including a conductivity dopant implanted between the first and second surface of the ultrathin semiconductor layer, the conductivity dopant only being present in the channel region;
     a first portion laterally adjacent to the channel region; and
     a second portion laterally adjacent to the channel region, the channel region being between the first portion and the second portion; and
   a gate structure on the channel region of the ultrathin semiconductor layer,
   wherein the first portion and the second portion have a same dimension between the first surface and the second surface as the channel region, and
   wherein the channel region includes indium gallium nitride.

7. The device of claim 6, wherein a doping level of the channel region ranges from about 15% to about 40%.

8. The device of claim 6, wherein a doping level of the channel region ranges from about 25% to about 35%.

9. The device of claim 6, wherein the conductivity dopant does not extend into the insulating layer.

10. The device of claim 6, wherein the first dopant profile of the first portion of the ultrathin semiconductor layer varies from the first surface to the second surface.

* * * * *